United States Patent [19]

Virkus et al.

[11] Patent Number: 5,001,541
[45] Date of Patent: Mar. 19, 1991

[54] ADVANCED ELECTROMIGRATION RESISTANT INTERCONNECT STRUCTURE AND PROCESS

[75] Inventors: Robert L. Virkus, Dallas; Hoang H. Hoang, Plano, both of Tex.

[73] Assignee: Texas Instruments Incorporated, Dallas, Tex.

[21] Appl. No.: 327,287

[22] Filed: Mar. 22, 1989

[51] Int. Cl.⁵ .................. H01L 23/48; H01L 29/40
[52] U.S. Cl. ........................... 357/68; 357/65; 357/71; 357/67; 437/957; 437/942; 437/180; 437/182
[58] Field of Search .............. 357/68, 67, 71, 65; 437/180, 182, DIG. 957, 942

[56] References Cited

U.S. PATENT DOCUMENTS

| | | | |
|---|---|---|---|
| 4,352,239 | 10/1982 | Pierce | 357/67 X |
| 4,438,450 | 3/1984 | Sheng et al. | 357/68 |
| 4,524,378 | 6/1985 | Cockrum | 357/71 |
| 4,566,177 | 1/1986 | Van de Ven et al. | |

Primary Examiner—William Mintel
Assistant Examiner—Roy K. Potter
Attorney, Agent, or Firm—Melvin Sharp; James T. Comfort; James C. Kesterson

[57] ABSTRACT

An advanced electromigration resistant lead (34) is formed over an insulator layer (36). The lead (34) is processed from a metallic film having a known grain size. A rapid thermal anneal is conducted to increase the grain size and to reduce the number of triple points. The lead (34) is also engineered to have rounded edges (40) rather than sharp edges. The rounded edges (40) reduce the amount of stress in the lead (34) and help further reduce the effects of electromigration.

18 Claims, 2 Drawing Sheets

ADVANCED ELECTROMIGRATION RESISTANT INTERCONNECT STRUCTURE AND PROCESS

TECHNICAL FIELD OF THE INVENTION

This invention relates in general to semiconductor processing, and in particular to an advanced electromigration resistant interconnect structure and process.

BACKGROUND OF THE INVENTION

In integrated circuit processing, electromigration has been an unresolved problem. Electromigration is caused by a transfer of momentum between flowing electrons and stationary metal atoms. The flowing electrons strike the metal atoms in a lead and have the greatest effect where three or more metal grains form a common boundary point (called a triple point) therebetween. The smaller the grain size of the metal, the more chances there are for multiple triple points between grains in any given volume. After sufficient migration has occurred, the depleted regions are macroscopically observable as voids, often at the triple points, that eventually destroy electrical continuity.

Conventional integrated circuit leads are formed from a metallic substance such as an aluminum alloy. The leads are patterned using standard photoresist techniques and anisotropic etches to form approximately vertical sidewalls and a flat top surface. A structure thus formed is subject to greater stress near the sharp corners between the vertical sidewalls and the flat top surface. Stress can cause the leads to crack which further enhances the effects of electromigration and may cause a cascading of electromigration effects on the rest of the lead.

Previous attempts to prevent or reduce the effects of electromigration have focussed on controlling the metallurgical microstructures of the metal. Various heat treatments have been attempted to optimize the thermal treatment in a conventional furnace in order to enhance the grain size and orientation of the metal. In the previous attempts to reduce the effects of electromigration, the results have been unsatisfactory and the circuit fabrication process has been lengthened. Thus, there is a need for a method to greatly reduce the effects of electromigration in a semiconductor integrated circuit lead without adding an excessive amount of time to the fabrication process.

SUMMARY OF THE INVENTION

The present invention disclosed herein describes an advanced electromigration resistant interconnect structure and process which eliminates or substantially reduces problems associated with electromigration. The present invention allows the formation of a metallic lead with a shape and grain size to reduce the effects of electromigration.

In accordance with one aspect of the invention, the effects of electromigration are reduced in an integrated circuit. Leads are formed from a metallic film having a known grain size which is deposited over an insulator on a semiconductor substrate. The grain size is enlarged such that the frequency of triple points is reduced, lessening the effects of electromigration.

In another aspect of the present invention, the leads are formed using a photoresist pattern deposited over the metallic film. The film is etched corresponding to the photoresist pattern, forming a standard lead with approximately vertical sidewalls. The leads are then exposed to a rapid thermal anneal, which causes the grains to combine and increase in size, simultaneously decreasing the number of triple points. The rapid thermal anneal also tends to round the edges of the vertical sidewalls, which will reduce stress within the lead.

The shape of the leads may be engineered by additional processes which allow a rounded shape for the entire lead. One such method is to isotropically etch the insulator to form a rounded trench. The metallic film deposited thereafter and appropriately patterned will be formed with a rounded bottom portion which may then be subsequently provided with a rounded top portion by a rapid thermal anneal.

It is a technical advantage of the present invention that electromigration is reduced in semiconductor integrated circuit interconnect structures. It is a further technical advantage of the present invention that stress may be reduced in the leads of an integrated circuit. It is a still further technical advantage that the shape of the lead may be engineered to reduce stress and electromigration.

BRIEF DESCRIPTION OF THE DRAWINGS

For a more complete understanding of the present invention and for further advantages thereof, reference is now made to the following Detailed Description, taken in conjunction with the accompanying Drawings in which.

DETAILED DESCRIPTION OF THE INVENTION

Figure 1A:
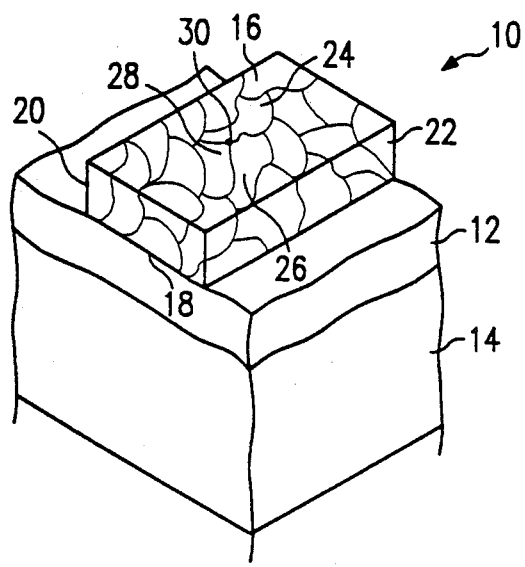
FIG. 1a is a perspective view of an integrated circuit lead constructed in accordance with the prior art.

Referring to FIG. 1a, a perspective view of an interconnect structure or lead constructed in accordance with the prior art is generally identified by the reference numeral 10. The lead 10 is formed on an insulator layer 12, such as silicon dioxide, which is formed over a silicon semiconductor substrate 14.

The lead 10 is formed by techniques well known in the art, such as using a photoresist pattern and a plasma etch. The lead 10 is formed over the surface of the insulator 12 such that, when viewed from a cross-section, the lead 10 resembles a rectangle having a flat top surface 16, a flat bottom surface 18 and approximately vertical sidewalls 20 and 22. The lead 10 is formed from a metallic substance such as aluminum or an aluminum alloy having a known grain size. The grains, for example grains 24, 26 and 28, may connect to each other in such a way as to form a triple point, as indicated at 30.

Figure 1B:
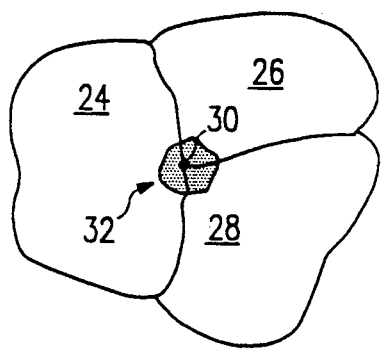
FIG. 1b is a plan view of a triple point illustrating the effects of electromigration.

As electrons flow through the lead 10, they cause electromigration, which is most severe at the triple point, such as the point 30. The electrons tend to create an open in the lead 10 by depleting materials to form a void 32 at the point 30, which can destroy the integrated circuit of which lead 10 is a portion (FIG. 1b).

Figure 2:
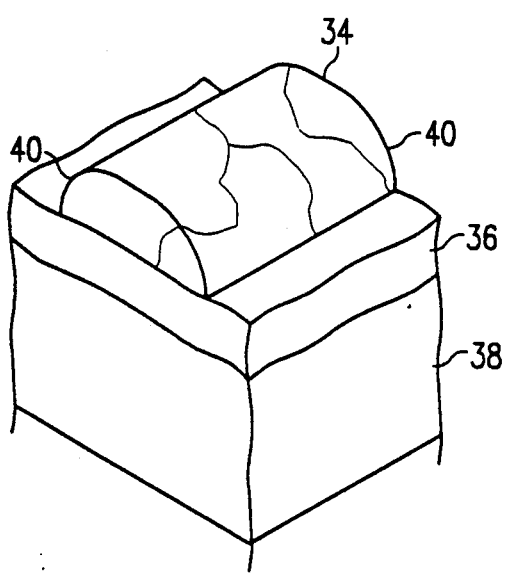
FIG. 2 is a perspective view of a lead constructed in accordance with the present invention.

Referring to FIG. 2, a lead 34 constructed in accordance with the present invention is shown in perspective. The lead 34 is formed on the insulator 36, which is formed over a semiconductor substrate 38, as will be subsequently described in greater detail. As a result of the method of the present invention the lead 34 rather than having vertical sidewalls as in accordance with the prior art, is formed with nonsharp or rounded edges 40. As used herein, rounded is defined as having nonsharp corners or edges such as between a vertical sidewall and a flat horizontal surface rather than as representing a semicircle, an ellipse, an oval or etc.

The lead 34 is constructed of a metallic material such as aluminum or an aluminum alloy having a grain size larger than the naturally occurring known grain size of the metal. As a result of the present invention, the grain size is enlarged, thereby lessening the number of triple points. In a lead, as in any structure, the weakest point is the first to fail, and the weakest point in any lead in reference to electromigration is the triple points. By reducing the number of triple points, the effects of electromigration are reduced since there are fewer weak points. Although not required, it is preferable to form the lead 34 with the grains much larger than the width of the lead 34, thereby forming only single boundaries with other grains known as a bamboo structure.

The lead 34 is engineered to have rounded edges 40 which also help reduce the effects of stress. Since sharp corners are eliminated from the lead 34, cracks induced by stress are likewise greatly reduced. The reduction of stress cracks also helps reduce the effects of electromigration in the lead 34 making the lead 34 superior to leads formed in accordance with the prior art. Additionally, improved planarization of subsequent metallized layers results from the rounded edges 40. Rounded edges will also lower capacitance and reduce cross-talk.

Figure 3B:
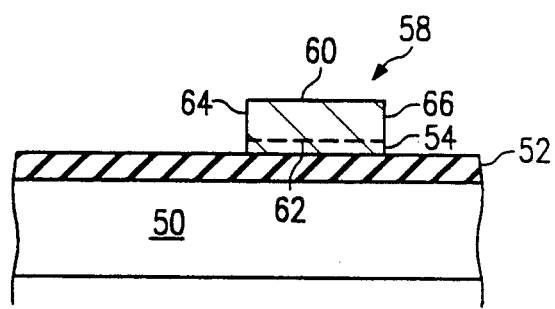
FIGS. 3a-c are cross-sectional views illustrating construction of a lead in accordance with the present invention.
Figure 3A:
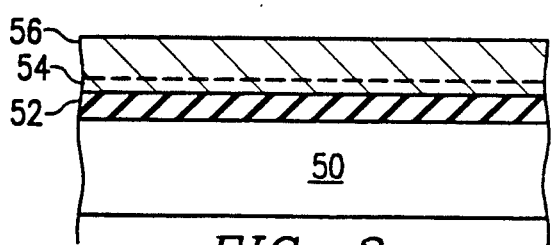
Figure 3C:
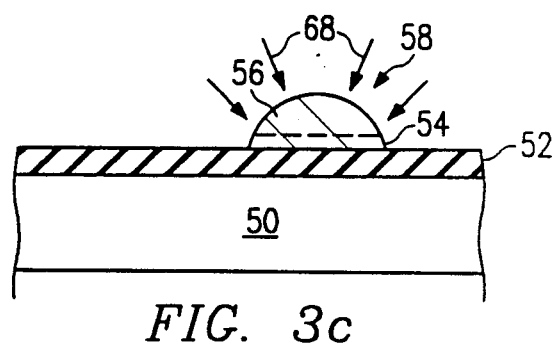

Referring to FIGS. 3a-c, a method for forming an electromigration resistant structure in accordance with the present invention is shown in cross-section. In FIG. 3a, a silicon substrate 50 is coated with an insulator 52. If there is a concern with possible spiking (a condition in which a metallic substance is diffused into an adjacent layer) a protective barrier layer 54 may be deposited over the insulator 52. The barrier layer 54 may comprise, for example, titanium-tungsten or any other suitable material capable of preventing or deterring the diffusion of a metal. A metallic material 56 is then deposited over either the barrier layer 54 or the insulator layer 52. The metallic layer 56 may comprise, for example, an aluminum alloy, and may be deposited by any appropriate method, such as chemical vapor deposition or sputtering.

Referring to FIG. 3b, a lead 58 has been formed using conventional processing such as, for example, patterning a photoresist layer and then etching the metallic layer 56 corresponding to the patterned resist. The lead 58 has a relatively flat upper surface 60, a relatively flat lower surface 62 and generally vertical sidewalls 64 and 66.

As indicated by arrows 68 in FIG. 3c, the lead 58 is subjected to a process which causes the metallic grains to combine forming larger grains with fewer triple points. It is preferable that the process also rounds the otherwise sharp corners formed by the intersection of the top 60 and the vertical sidewalls 64–66.

The process 68 preferably comprises a rapid thermal anneal conducted in a rapid thermal processor (not shown). The lead 58 is subjected to a ramp-up to 600° C. in approximately three seconds, followed by a hold at 600° C. for thirty seconds and finally, a ramp-down of thirty seconds to an original temperature. The temperature used in the rapid thermal processor in accordance with the present invention is comparatively much higher (600° C. versus 440 or 450° C.) than the temperatures in the conventional furnaces used in the prior art. It has been found that by exposing the metallic substance of the lead 58 to a rapid thermal processor, the grain size can increase from less than 2.0 microns to greater than 4.0 microns. Additionally, the rapid thermal anneal rounds the otherwise sharp edges of the lead 58. This increase in grain size in conjunction with the rounding of the edges and the corresponding decrease in the number of triple points can increase the lifetime of an integrated circuit with the same current passing therethrough.

It is to be understood that although 600° C. is used as an example, it is not meant to be limiting. It is an important aspect of the present invention that the metal is caused to reflow and since there are obviously many time, temperature, pressure and metal combinations possible, the above mentioned time and temperature parameters are for example only.

Alternatively, the process 68 could be performed prior to patterning the layer 56. The grain size would be increased and the number of triple points would be reduced, but the sidewalls would still be vertical after patterning. An isotropic etch could then be performed on the lead to remove the sharp corners and round the edges to engineer the shape of the lead and further reduce the effects of electromigration.

Additionally, other devices could be used to conduct the process 68 such as a laser pulse from a laser to enlarge the grain size and to round the edges. A lead would require a series of laser pulses to conduct the process 68 along the entire length of the lead. A laser pulse is typically in the range of one milimeter square and therefore the laser would require a step-pulse action for each milimeter of lead length.

Figure 4A:
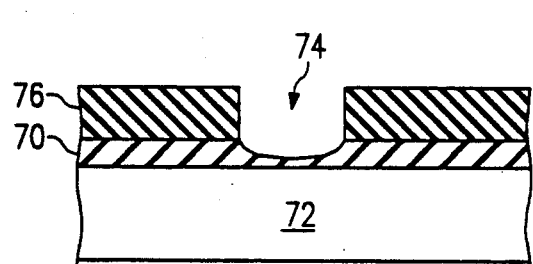
FIGS. 4a-d are cross-sectional views of an alternative method for constructing a lead in accordance with the present invention.

Referring to FIGS. 4a-d, an alternative embodiment of the method of the present invention is illustrated in cross-sectional view. In FIG. 4a, an insulator layer 70, formed over a silicon semiconductor substrate 72, has been patterned and etched by a standard photoresist process to form a trench 74 through a photoresist 76 and partially into the insulator 70. The trench 74 has rounded edges within the insulator layer 70 as a result of an isotropic etch using, for example, a fluorine based etch or a wet etch.

Figure 4B:
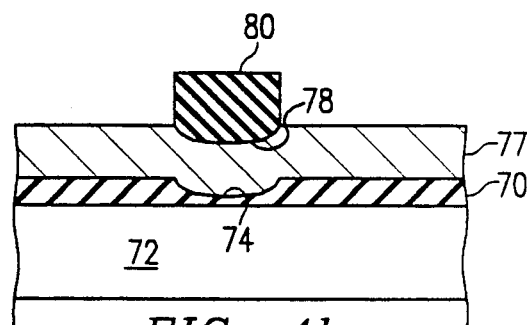

Referring to FIG. 4b, the resist 76 has been stripped, and a metallic layer 77 which may comprise an aluminum alloy has been deposited over the insulator 70. The metallic layer 77 fills into the trench 74 and thus forms a similar depression on the top surface at 78. A photoresist layer is deposited over the metallic layer 76, which is patterned and developed to form a mask 80. Although not shown, it is to be understood that if spiking is a concern, a diffusion barrier layer may be deposited over the insulator 70 prior to the deposition of the metallic layer 77.

Figure 4D:
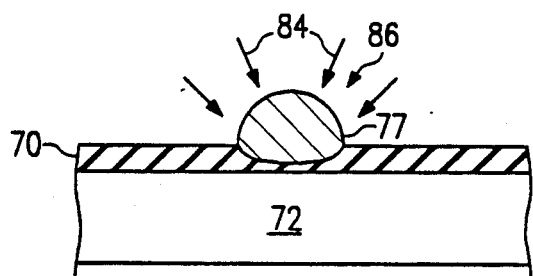
Figure 4C:
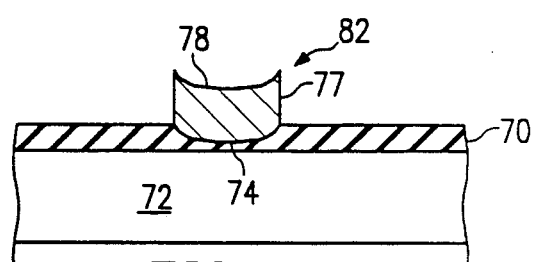

Referring to FIG. 4c, the metallic layer 77 has been etched to remove all but what is protected by the mask 80, to form a structure 82. The mask 80 is removed by a standard resist strip as is well known in the art.

Referring to FIG. 4d, the structure 82 is then subjected to a process as indicated by arrows 84, such as a rapid thermal anneal or a laser pulse, as previously described above with reference to FIGS. 3a-c. Due to the process 84, a lead 86 is formed with rounded edges and with the grains therein having a size larger than normally occurring in the metal. The larger grain size reduces the frequency of triple points and thus reduces the effects of electromigration. In addition, the rounding of all edges of the lead 86 will reduce stress therein which normally occurs at sharp edges and thus further reduces the effects of electromigration.

Alternatively it is possible to conduct the process 84 on the metallic layer 77 prior to the patterning and etching as illustrated in FIGS. 4b and 4c. The process 84 will still increase the size of the grains in the metallic layer 77, decrease the number of triple points and thus reduce the effects of electromigration. If further reduction of the effects of electromigration is desired the structure 82 may then be engineered to have rounded edges by isotropically etching the structure 82.

Figure 5A:
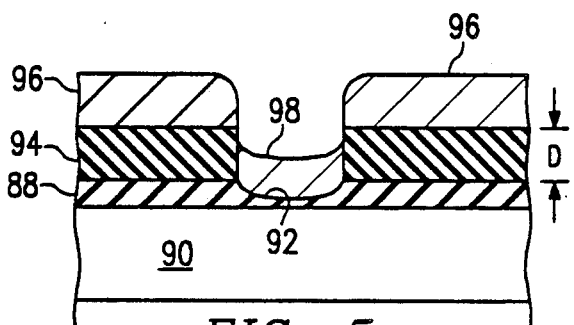
FIGS. 5a-b are cross-sectional views of a further alternative method for constructing a lead in accordance with the present invention.
Figure 5B:
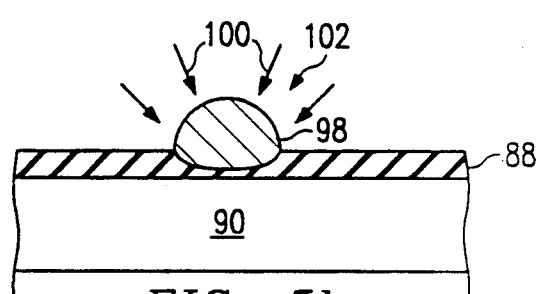

Referring to FIGS. 5a-b, a further alternative embodiment of the method of the present invention is illustrated in cross-sectional view. In FIG. 5a, an insulator layer 88 is formed over a substrate 90 and patterned to form a rounded trench 92, using a standard photoresist layer 94, which is patterned and isotropically etched. The resist layer 94 is formed to a depth D, which is greater than typically used in photoresist patterning processes. A metallic film is then deposited over the resist 94 and into the rounded trench 92. Due to the depth D of the photoresist 74, a top film portion 96 and a separated film portion 98 are formed. It is important that the photoresist 94 have a depth D great enough to prevent the portion 98 from contacting any of the portion 96.

The portion 96 is then lifted off during removal of the resist 94 using a resist strip. Although not shown, it is to be understood that a diffusion barrier layer, for example, titanium-tungsten, may be applied over the insulator layer 88 prior to the deposition of resist 94 to prevent spiking.

Referring to FIG. 5b, the metallic portion 98 is processed as indicated by arrows 100, for example, by a rapid thermal anneal or a laser pulse. The portion 98 is formed into a lead 102 having rounded edges which reduce stress therein as previously described above. The lead 102 has grains larger than the normal grain size of the metallic film and thus fewer triple points are formed and the effects of electromigration are reduced.

The methods herein described allow the engineering of a semiconductor integrated circuit interconnect structure heretofore unknown. The effects of electromigration are reduced by the increased size of the grains of the metallic film used to form the interconnect structure. By increasing the grain size, the number of triple points is reduced, which reduces the number of the weakest points in the interconnect structure. By thus reducing the number of the weakest points, the effects of electromigration are reduced. If so desired, the structure may also be formed with rounded edges to reduce stress thereon and to further reduce the effects of electromigration.

Although the present invention has been described with respect to a specific preferred embodiment thereof, various changes and modifications may be suggested to one skilled in the art, and it is intended that the present invention encompass such changes and modifications as fall within the scope of the appended claims.

What is claimed is:

1. An improved semiconductor integrated circuit structure, comprising:
    a metallic film having a known grain size and a number of triple points; and
    a lead formed from said film, said lead having a grain size larger than said known grain size and fewer, but a non-zero number of, triple points than said film to lessen electromigration effects in said lead.

2. The structure of claim 1, wherein said lead has rounded edges along a top surface thereof to reduce stress and to further reduce electromigration effects in said lead.

3. The structure of claim 1, wherein said lead has rounded edges along a bottom surface thereof to reduce stress and to further reduce electromigration effects in said lead.

4. The structure of claim 1, wherein said lead has rounded edges along a top surface and a bottom surface thereof to reduce stress and to further reduce electromigration effects in said lead.

5. A method for reducing electromigration effects in an integrated circuit structure formed on a semiconductor substrate, comprising the steps of:
    forming a lead over an insulator on the substrate from a metallic film having a known grain size; and
    increasing said known grain size, by exposing said metallic film to a rapid thermal anneal, such that a total number of triple points within said lead is lessened to reduce electromigration effects in the integrated circuit interconnect structure.

6. The method of claim 5, wherein said step of increasing said known grain size is conducted prior to said step of forming a lead.

7. The method of claim 5, wherein said step of increasing said known grain size is conducted after said step of forming a lead.

8. The method of claim 5, wherein the step of exposing said metallic film to a rapid thermal anneal comprises:
    ramping-up to a temperature of approximately 600° C. in approximately three seconds;
    holding said temperature for approximately thirty seconds; and
    ramping-down from said temperature in approximately thirty seconds.

9. The method of claim 5, further comprising a step of isotropically etching said leads to round edges thereof and reduce stress therein.

10. The method of claim 9, wherein the step of isotropically etching comprises wet etching.

11. The method of claim 9, wherein the step of isotropically etching comprises plasma etching.

12. The method of claim 5, wherein the step of forming leads comprises:
    forming a photoresist pattern over said film; and
    etching said film corresponding to said photoresist pattern.

13. The method of claim 5, wherein the step of forming leads comprises:
    forming a first photoresist pattern over said insulator;
    isotropically etching said insulator corresponding to said first pattern to form a rounded trench in said insulator;
    stripping said photoresist;

depositing a metallic film over said insulator and in said rounded trench;

forming a second photoresist pattern over said film in said rounded trench; and etching said film corresponding to said second pattern to form said lead.

14. The method of claim 5, wherein the step of forming leads comprises:

depositing a relatively thick layer of photoresist over said insulator;

forming a pattern in said photoresist;

isotropically etching said insulator corresponding to said pattern to form a rounded trench in said insulator;

depositing a metallic film over said photoresist and into said rounded trench such that said film in said trench is separated from said film over said photoresist; and removing said photoresist to lift off said film and form said lead in said trench.

15. The method of claim 5, further comprising the step of forming a diffusion barrier over said insulator to reduce the likelihood of spiking.

16. A method for defining a shape of a metallic lead to reduce the effects of stress and electromigration in a semiconductor integrated circuit, comprising the steps of:

depositing a metallic film over an insulator;

patterning said film to form the lead; and processing the lead, by rapid thermal annealing of the lead in a rapid thermal processor, to configure the shape of the lead to reduce electromigration therein.

17. The method of claim 16, wherein the step of annealing comprises:

ramping-up to a temperature of approximately 600° C. for approximately three seconds;

holding said temperature for approximately thirty seconds; and ramping-down to an original temperature in approximately thirty seconds.

18. The method of claim 16, wherein the step of processing the lead comprises exposing the lead to a laser pulse.

* * * * *